United States Patent
Chen

(10) Patent No.: US 6,381,138 B1
(45) Date of Patent: Apr. 30, 2002

(54) COMPUTER CASE SIDE COVER PANEL LOCKING/UNLOCKING CONTROL ARRANGEMENT

(75) Inventor: Chih-Yoe Chen, Taoyuan Hsien (TW)

(73) Assignee: Enlight Corporation, Taoyuan Hsien (TW)

( * ) Notice: Subject to any disclaimer, the term of this patent is extended or adjusted under 35 U.S.C. 154(b) by 24 days.

(21) Appl. No.: 09/628,444

(22) Filed: Jul. 28, 2000

(51) Int. Cl.$^7$ ................................................ H05K 7/18
(52) U.S. Cl. ...................... 361/724; 361/683; 312/223.2
(58) Field of Search ................................ 361/679, 683, 361/685, 724–727, 732, 754, 747, 759; 312/114, 138.1, 139, 139.2, 215, 216, 222, 293.1, 293.3, 294, 301, 223.3, 332.1, 333, 334.1, 334.2

(56) References Cited

U.S. PATENT DOCUMENTS 6,231,144 B1 * 5/2001 Chen et al. .............. 312/332.1
6,257,682 B1 * 7/2001 Liu et al. .................. 312/223.2
6,297,948 B1 * 10/2001 Buican et al. ............... 361/683

* cited by examiner

Primary Examiner—Lynn D. Feild
Assistant Examiner—Yean-Hsi Chang
(74) Attorney, Agent, or Firm—Troxell Law Office PLLC

(57) ABSTRACT

A computer case side cover panel locking/unlocking control arrangement includes a computer case, the computer case having a vertical flange, a horizontal top flange and a horizontal bottom flange around a side opening thereof, a side cover panel adapted to cover the side opening of the computer case, and two control levers respectively mounted on the side cover and adapted to lock/unlock the side cover panel, each control lever each having a handle unit for operation by hand to turn the respective control lever between the locking position and the unlocking position, and an actuating unit pivoted to the side cover panel, the actuating unit having a protruded guide rod inserted into a respective curved sliding slot on the vertical flange and stopped at one end of the respective curved sliding slot.

2 Claims, 6 Drawing Sheets

COMPUTER CASE SIDE COVER PANEL LOCKING/UNLOCKING CONTROL ARRANGEMENT

BACKGROUND OF THE INVENTION

The present invention relates to a computer case, and more particularly to a computer case side cover panel locking/unlocking control arrangement, which enables the side cover panel of a computer case to be quickly locked/unlocked with less effort.

At the present time of information age, computer has been intensively used in different fields and industries for different purposes. In order to attract consumers, regular computer (mainframe) cases are made compact and detachable. A regular computer case generally comprises a side opening through which computer parts are installed in the case, and a side cover panel adapted to close the side opening after installation of the related computer parts. According to conventional methods, hooks are provided at the side cover panel and adapted for hooking in respective hook holes on the computer case, and screws are installed to fixedly secure the side cover panel to the computer case. When dismantling the side cover panel, the screws must be removed at first. However, it is complicated to disconnect the screws from the side cover panel and the computer case.

SUMMARY OF THE INVENTION

It is main object of the present invention to provide a computer case side cover panel locking/unlocking control arrangement, which enables the side cover panel of a computer case to be quickly locked/unlocked with less effort. According to one aspect of the present invention, the computer case side cover panel locking/unlocking control arrangement comprises a computer case, the computer case having a vertical flange, a horizontal top flange and a horizontal bottom flange around a side opening thereof, a side cover panel adapted to cover the side opening of the computer case, and at least one, for example, two control levers respectively mounted on the side cover and adapted to lock/unlock the side cover panel, each control lever each having a handle unit for operation by hand to turn the respective control lever between the locking position and the unlocking position, and an actuating unit pivoted to the side cover panel, the actuating unit having a protruded guide rod inserted into a respective curved sliding slot on the vertical flange and stopped at one end of the respective curved sliding slot. According to another aspect of the present invention, the computer case comprises a plurality of hook holes respectively disposed on the horizontal top flange and the horizontal bottom flange, and the side cover panel comprises a plurality of hooks adapted for hooking in the hook holes on the horizontal top flange and the horizontal bottom flange.

DETAILED DESCRIPTION OF THE PREFERRED EMBODIMENT

Figure 1:
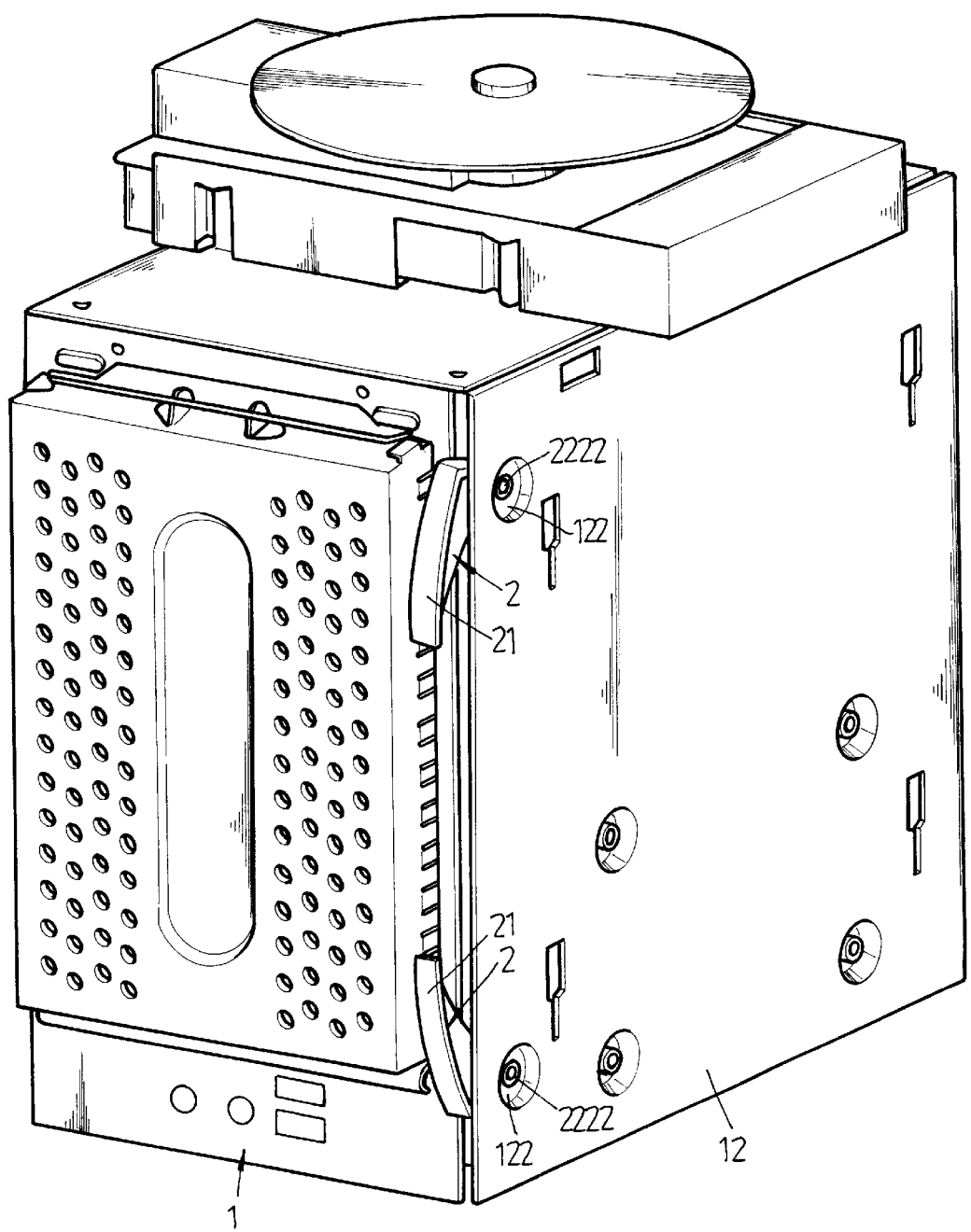
FIG. 1 is a perspective view of the present invention, showing the side cover panel locked.
Figure 2:
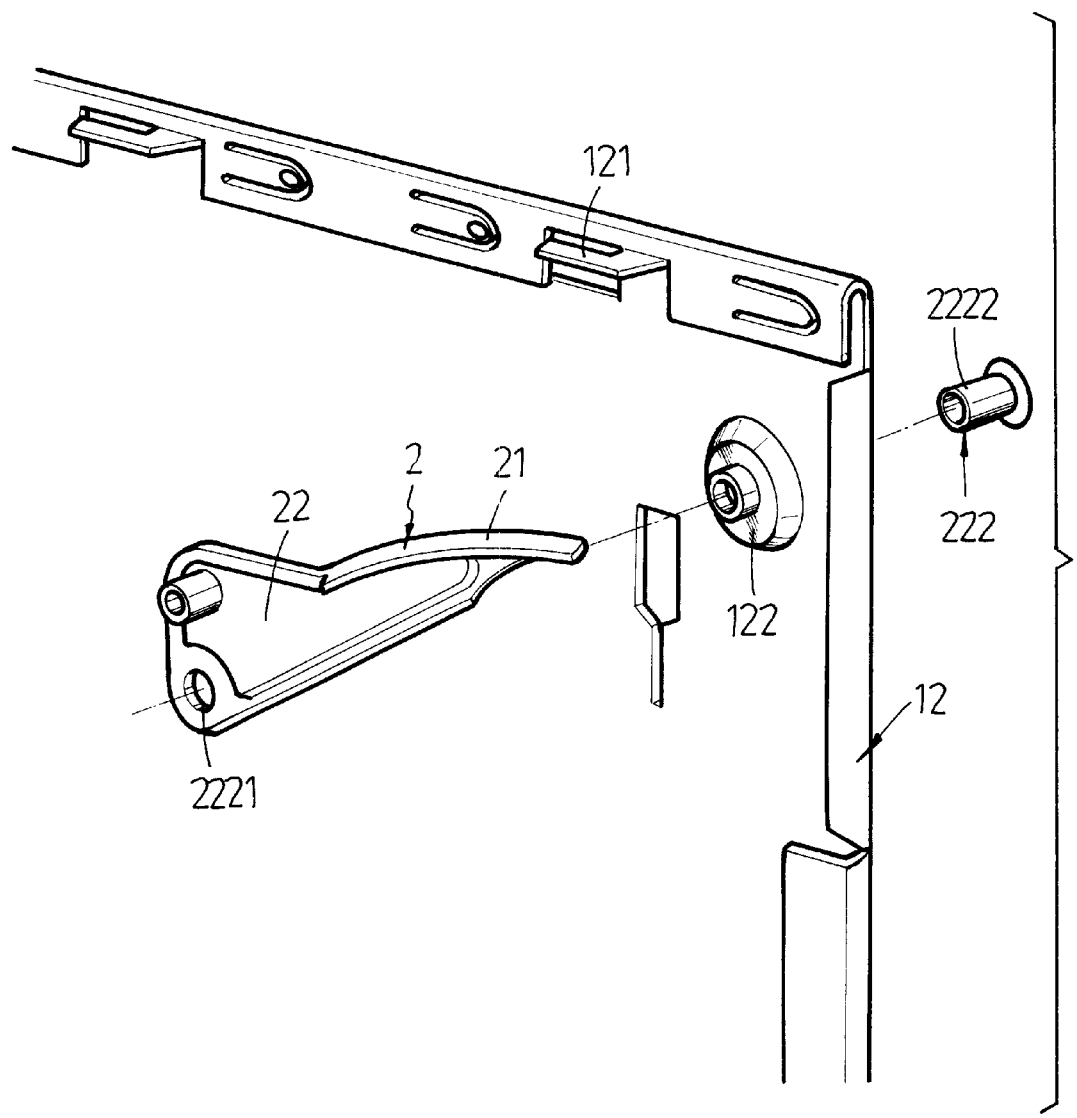
FIG. 2 is an exploded view of a part of the present invention.

Referring to FIGS. 1 and 2, at least one, for example, two control levers 2 are provided at the inside wall of a side cover panel 12, which is adapted to close the side opening 11 of the computer case 1. The computer case 1 comprises a vertical flange 111 disposed at one lateral side of the side opening 11, and two horizontal flanges 113 respectively disposed at top and bottom sides of the side opening 11. The vertical flange 111 comprises two curved sliding slots 112 corresponding to the control levers 2 at the side cover panel 12. The horizontal flanges 113 each comprise a plurality of hook holes 114 adapted to receive respective hooks 121 at the side cover panel 12. The control levers 2 each comprise a handle unit 21 and an actuating unit 22 integral with one end of the handle unit 21. The actuating unit 22 comprises a protruded guide rod 221, and pivot means 222. The pivot means 222 comprises a through hole 2221, and a rivet 2222 mounted in the through hole 2221 and fixedly fastened to a respective holder block 122 at the side cover panel 12.

Figure 4:
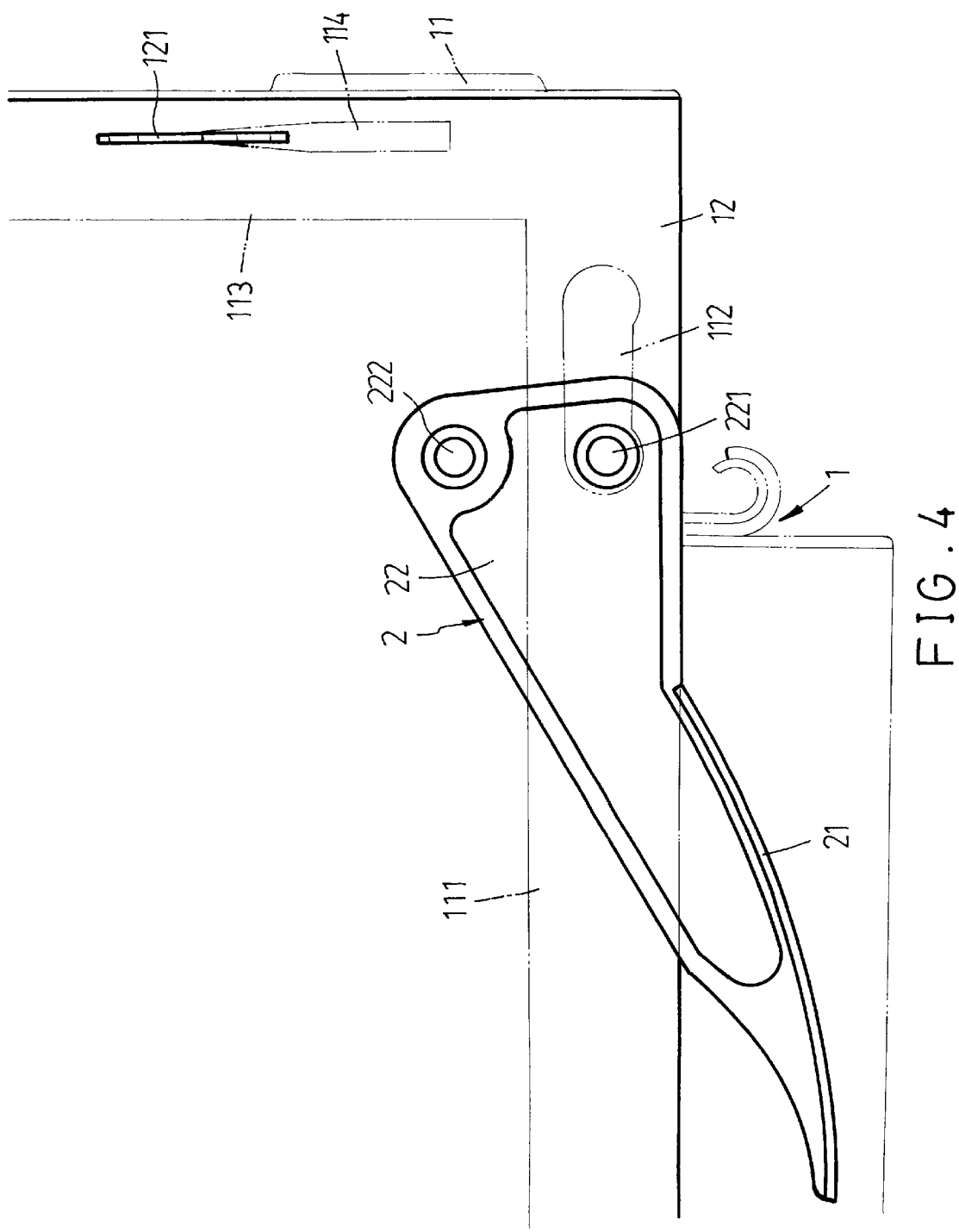
FIG. 4 is a plain view in an enlarged scale of a part of FIG. 1.

Referring to FIG. 4 and FIG. 1 again, when closing the side cover panel 12 on the side opening 11, the protruded guide rods 221 of the control levers 2 are respectively engaged into the curved sliding slots 112 on the vertical flange 111 and stopped at one end of the respective sliding slots 112, and the hooks 121 of the side cover panel 12 are respectively hooked in the hook holes 114 on the horizontal flanges 113 to secure the side cover panel 12 in the closed position.

Figure 3:
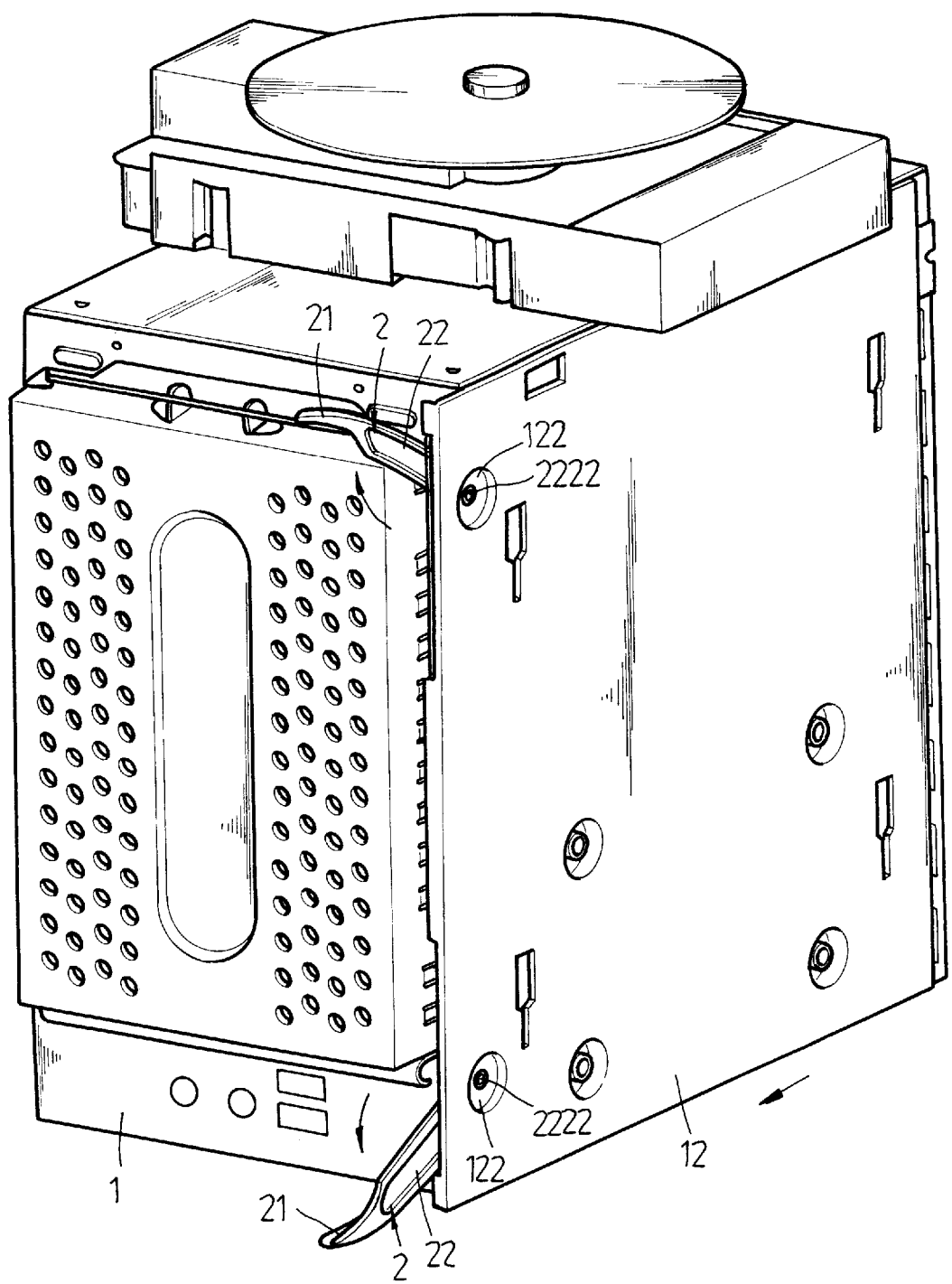
FIG. 3 is similar to FIG. 1 but showing the control levers turned to the unlocking position.
Figure 5:
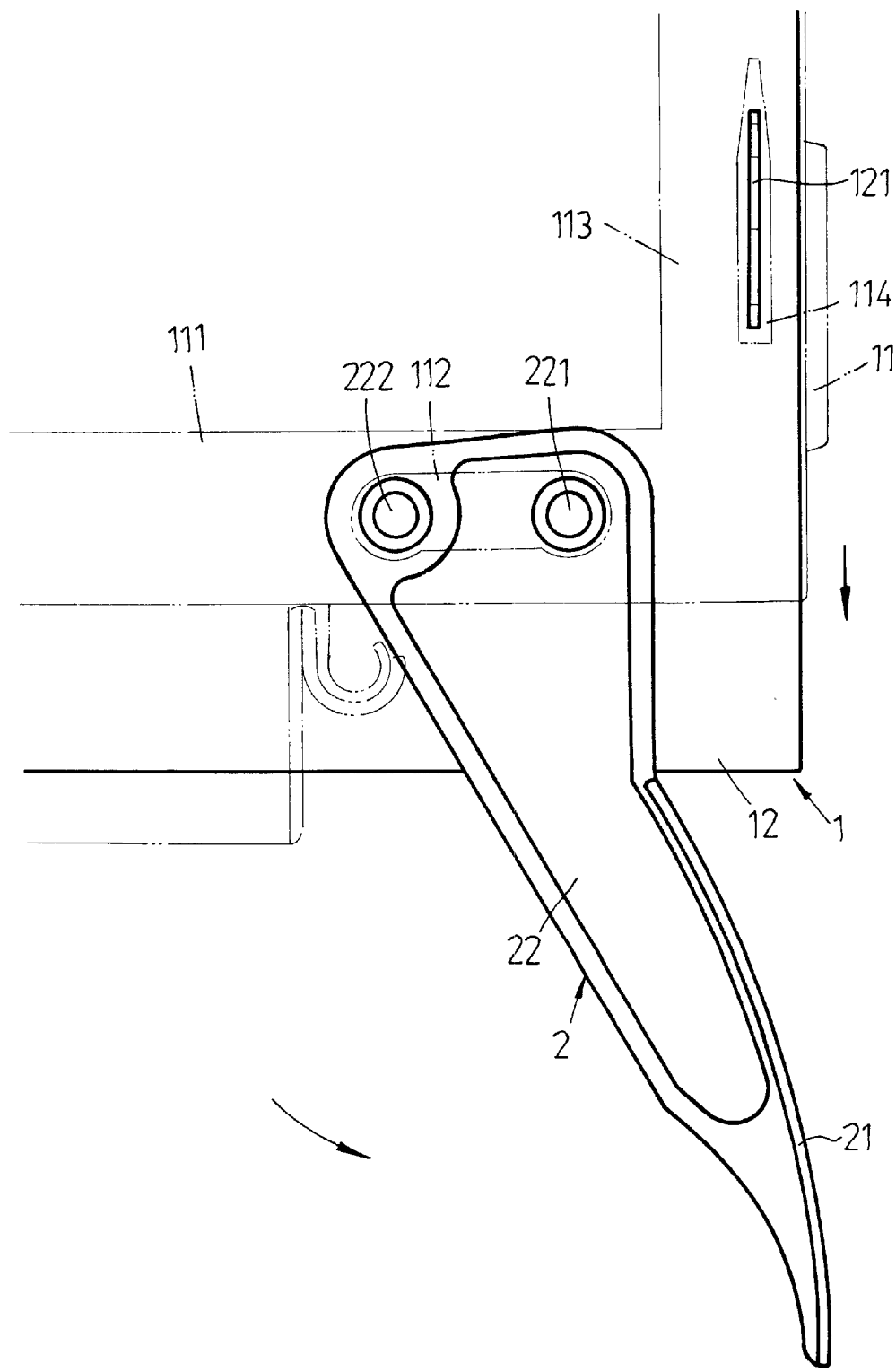
FIG. 5 is similar to FIG. 4 but showing the control lever turned to the unlocking position.
Figure 6:
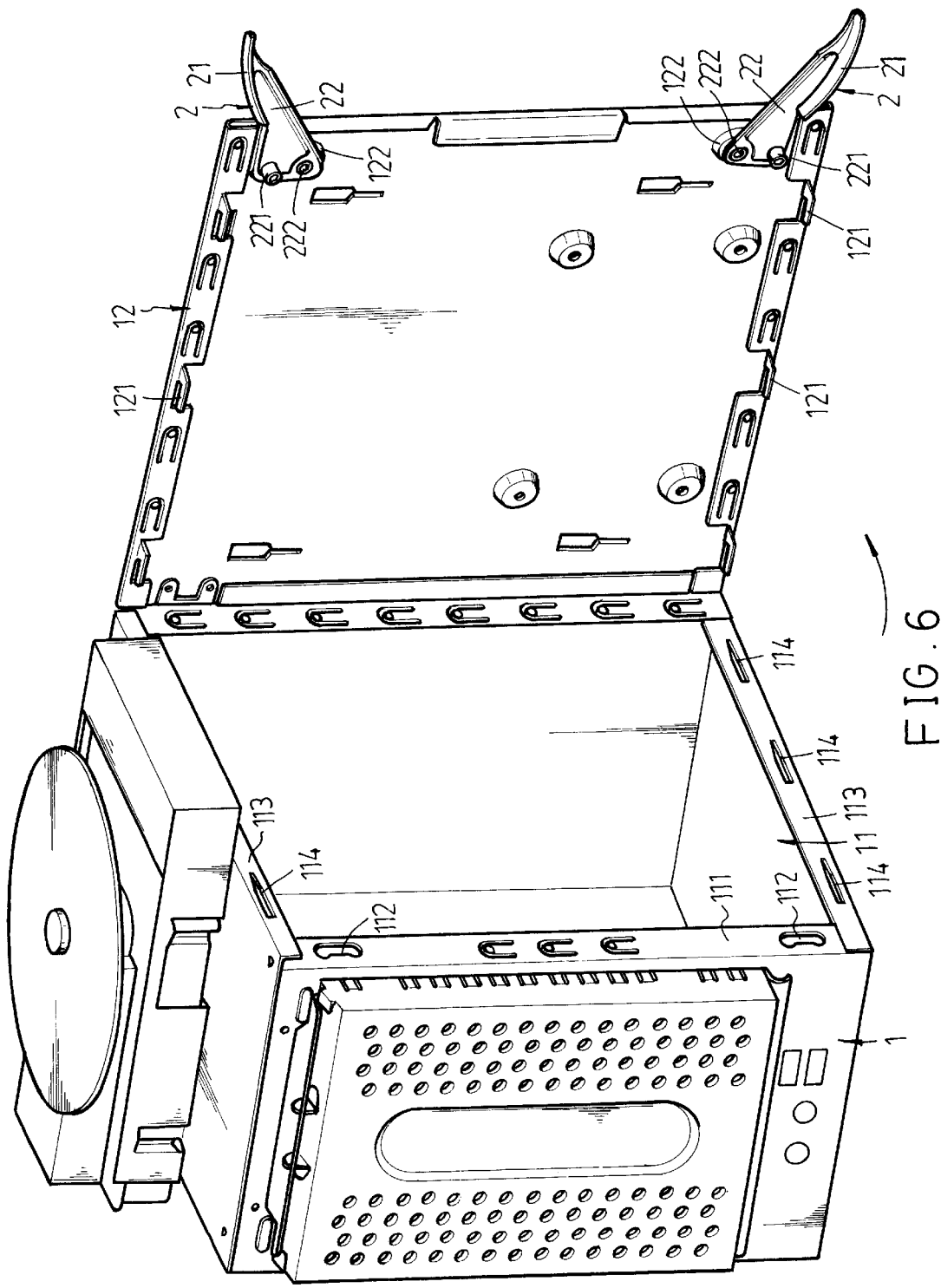
FIG. 6 is a perspective view of the present invention, showing the control levers disengaged from the curved sliding slots on the vertical flange and the side cover panel opened.

Referring to FIGS. 3 and 5, when operating the handle unit 21 of each control lever 2 to turn each control lever 2 about the respective rivet 2222, the actuating units 22 of the control levers 2 impart a pressure to the side cover panel 12 in direction toward the hinged side of the side cover panel 12 to the computer case 1, thereby causing the hooks 121 to be respectively disengaged from the respective hook holes 114 on the horizontal flanges 113, enabling the side cover panel 12 to be disconnected from the computer case 1.

While only one embodiment of the present invention has been shown and described, it will be understood that various modifications and changes could be made thereunto without departing from the spirit and scope of the invention disclosed.

What the invention claimed is:

1. A computer case side cover panel locking/unlocking control arrangement comprising:

a computer case, said computer case comprising a side opening, a vertical flange vertically disposed at one lateral side of said side opening, and two horizontal flanges horizontally disposed at top and bottom sides of said side opening, said vertical flange comprising at least one curved sliding slot;

a side cover panel adapted to cover the side opening of said computer case; and at least one control lever respectively mounted on said side cover panel and adapted to lock/unlock said side cover panel, said at least one control lever each comprising a handle unit for operation by hand to turn the respective control lever between a locking position and an unlocking position, and an actuating unit integral with one end of said handle unit, said actuating unit comprising a through hole, a rivet mounted in said through hole and fastened to said side cover panel for enabling the respective control lever to be turned about the rivet, and a protruded guide rod inserted into one curved sliding slot on said vertical flange and stopped at one end of the respective curved sliding slot.

2. The computer case side cover panel locking/unlocking control arrangement of claim 1 wherein said side cover panel comprises two rows of hooks horizontally disposed near top and bottom sides thereof, and said vertical flanges of said computer case each comprise a plurality of hook holes adapted to receive the hooks of said side cover panel.

* * * * *